United States Patent
Thompson et al.

[11] Patent Number: 5,431,421
[45] Date of Patent: Jul. 11, 1995

[54] SEMICONDUCTOR PROCESSOR WAFER HOLDER

[75] Inventors: Raymon F. Thompson, Lakeside; Timothy J. Reardon; Aleksander Owczarz, both of Kalispell, all of Mont.

[73] Assignee: Semitool, Inc., Kalispell, Mont.

[21] Appl. No.: 855,767

[22] Filed: Mar. 18, 1992

Related U.S. Application Data

[63] Continuation-in-part of Ser. No. 665,609, Mar. 6, 1991, abandoned, and Ser. No. 665,942, Mar. 6, 1991, Pat. No. 5,235,995, and Ser. No. 526,243, May 18, 1990, Pat. No. 5,168,887, and Ser. No. 328,888, Mar. 19, 1989, Pat. No. 5,168,886, which is a continuation-in-part of Ser. No. 198,732, May 25, 1988, abandoned.

[51] Int. Cl.⁶ .......................... B23B 31/32; F23M 9/10
[52] U.S. Cl. ................................. 279/139; 118/503; 118/730; 204/298.15; 134/149
[58] Field of Search ............... 134/149, 153, 157, 902; 118/503, 728–730; 204/298.15; 269/238, 239 R, 254 R; 279/4.05, 139

[56] References Cited

U.S. PATENT DOCUMENTS

| | | | |
|---|---|---|---|
| 3,585,668 | 6/1971 | Jaccodine et al. | 15/21 |
| 4,313,266 | 2/1982 | Tam | 34/8 |
| 4,651,440 | 3/1987 | Karl | 34/58 |
| 4,687,542 | 8/1987 | Davis et al. | 156/643 |
| 4,745,422 | 5/1988 | Matsuoka et al. | 354/299 |
| 4,788,994 | 12/1988 | Shinbara | 134/157 |

*Primary Examiner*—Steven C. Bishop
*Attorney, Agent, or Firm*—Wells, St. John, Roberts, Gregory & Matkin

[57] ABSTRACT

A wafer processor including a wafer support for holding semiconductor wafers. The wafer support member includes wafer gripping fingers mounted in receptacles formed through a wafer support plate. The fingers are angularly displaced to spread the fingers and allow loading of wafers therebetween. The fingers have central cores which are flexibly mounted within a mounting flange by a thin diaphragm. A pivot control supports the cores and carries axial loading. The pivot control members preferably are U-shaped and can serve as connections to an actuator. A locking mechanism is also shown to secure the actuator connection.

44 Claims, 11 Drawing Sheets

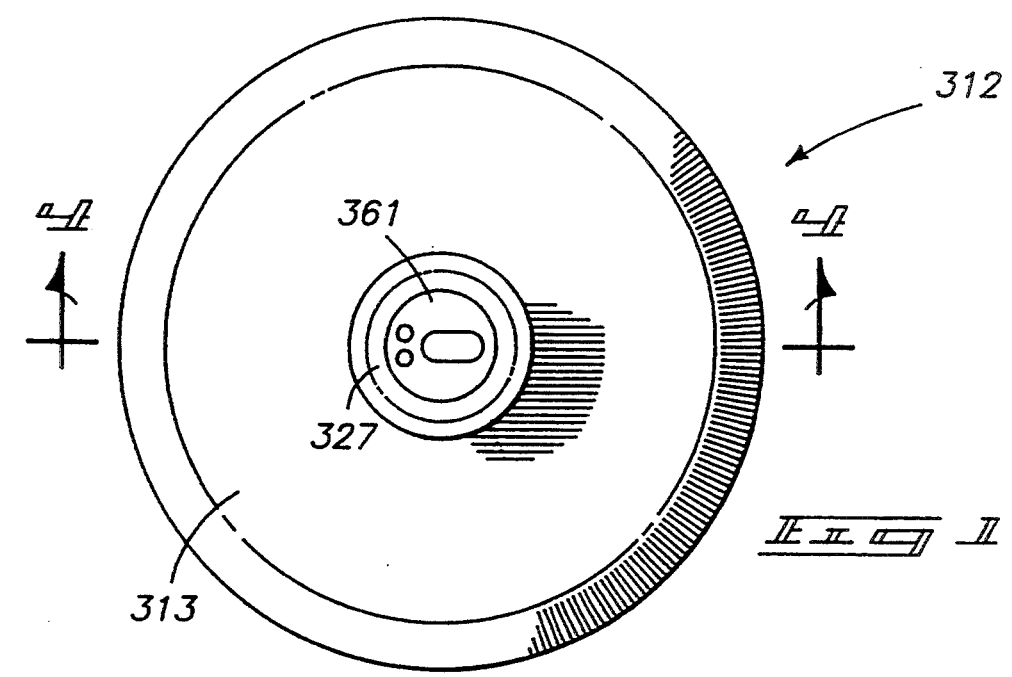
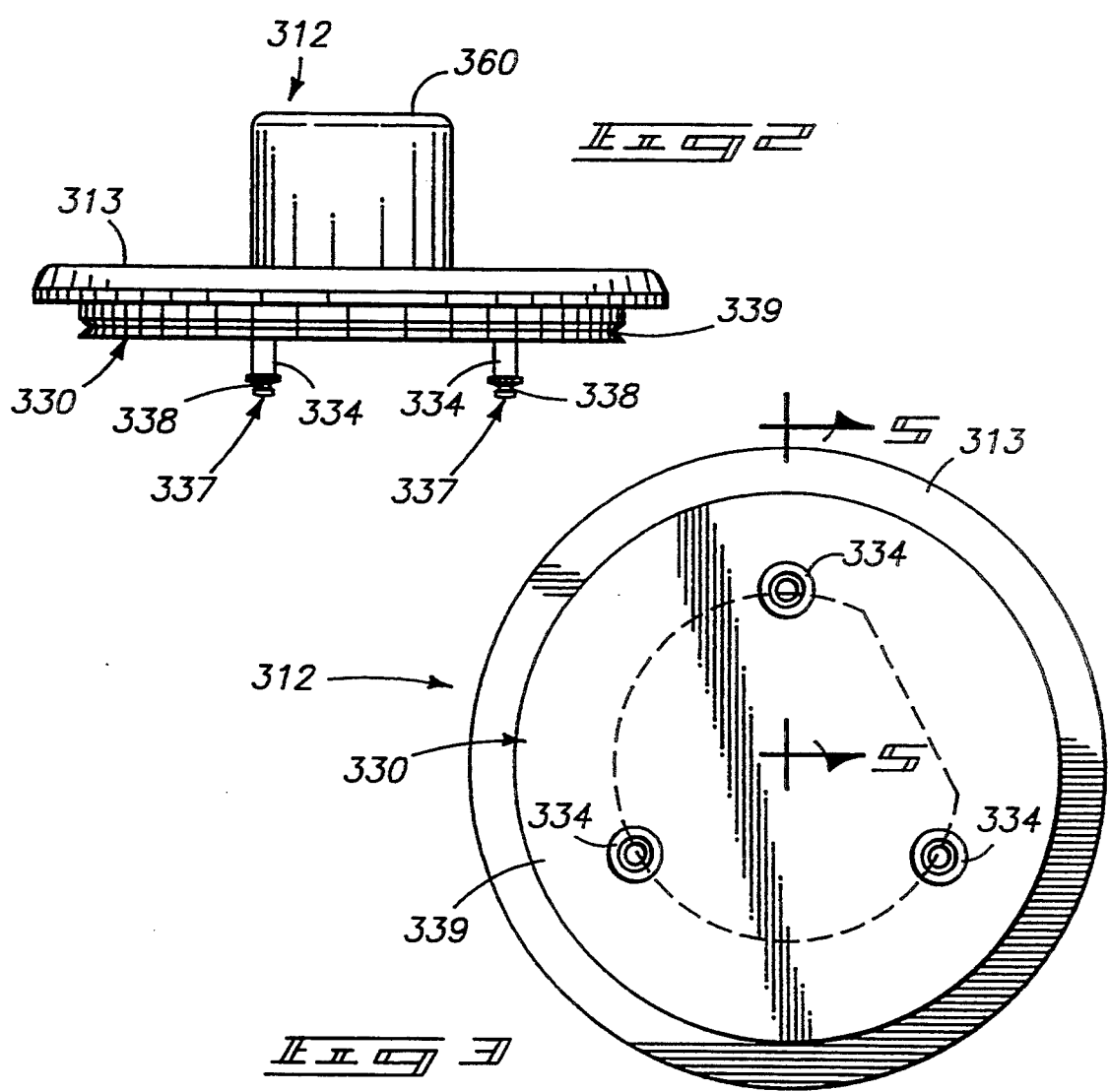

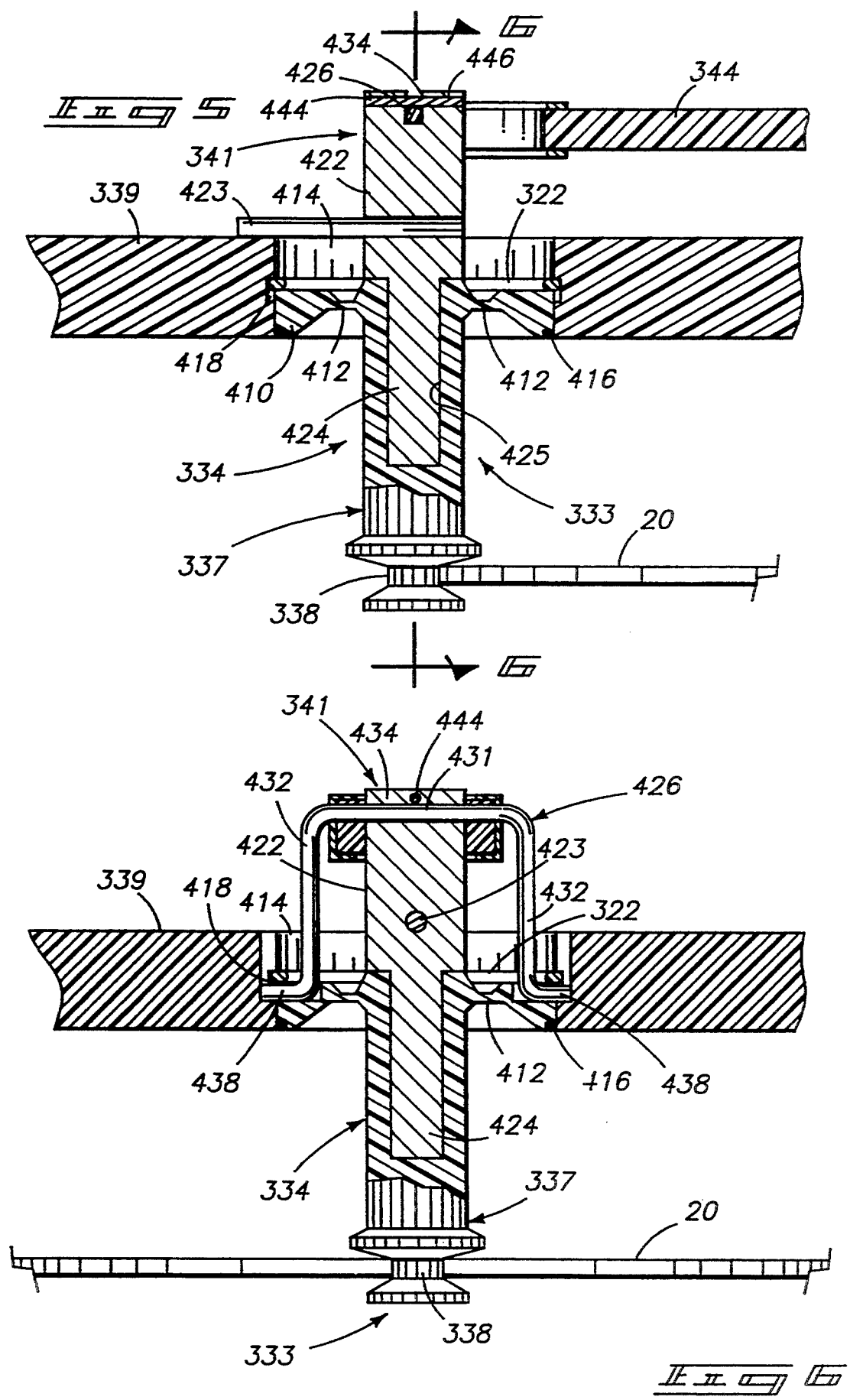

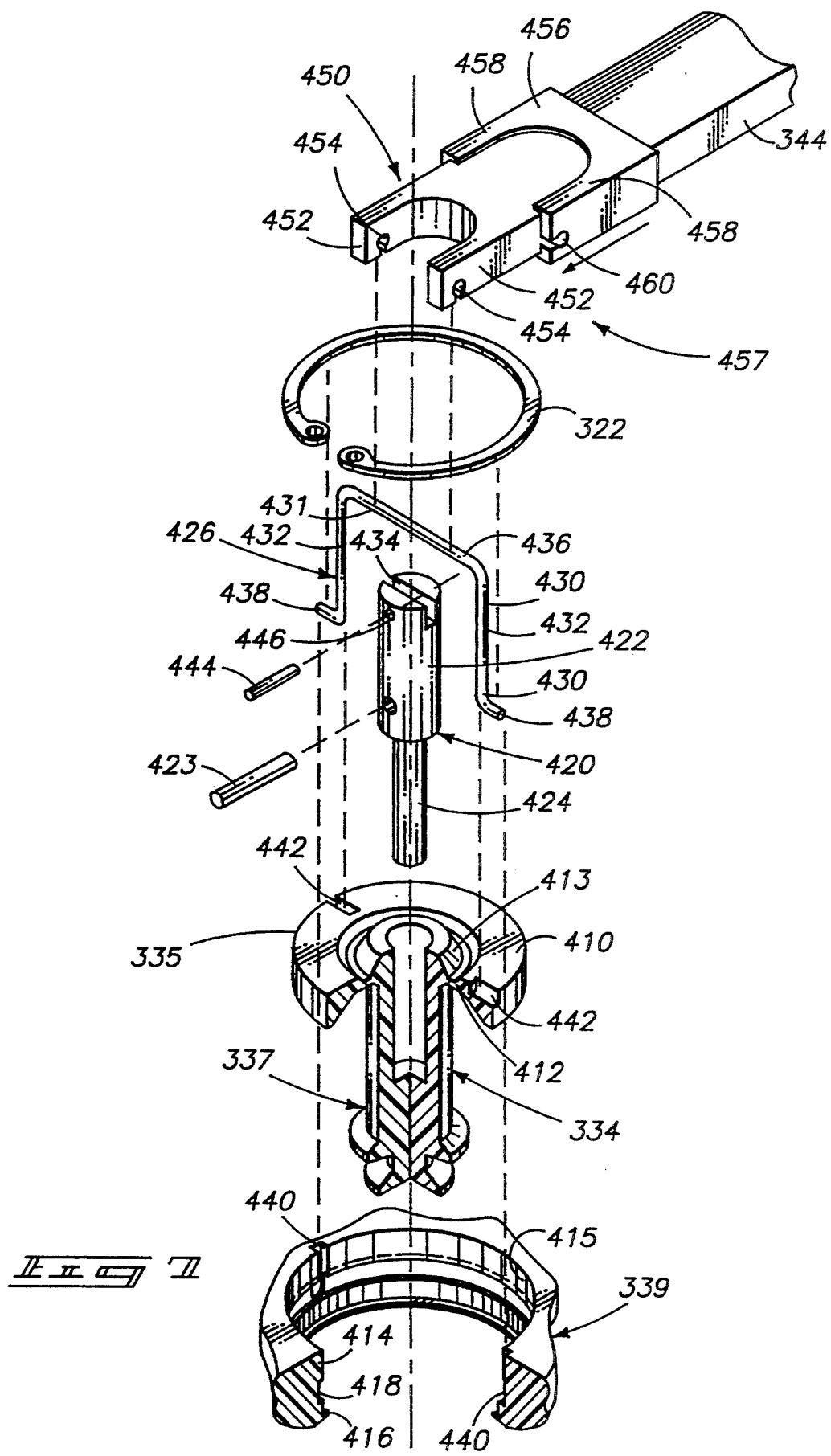

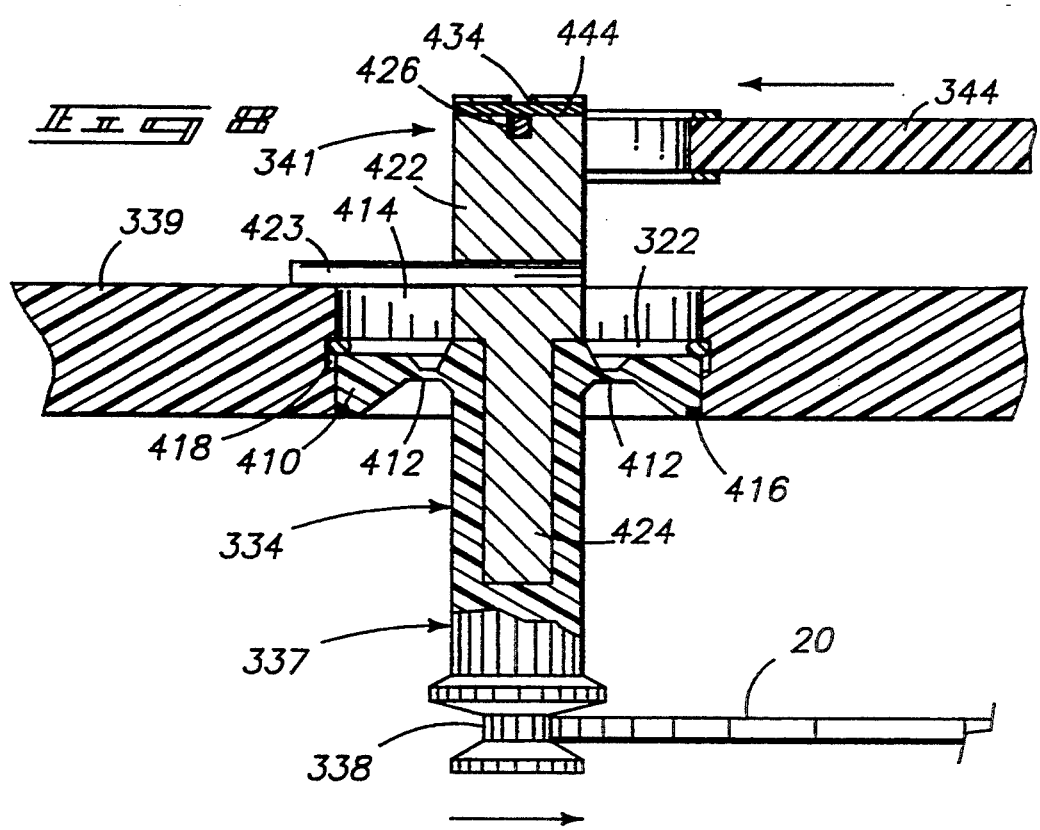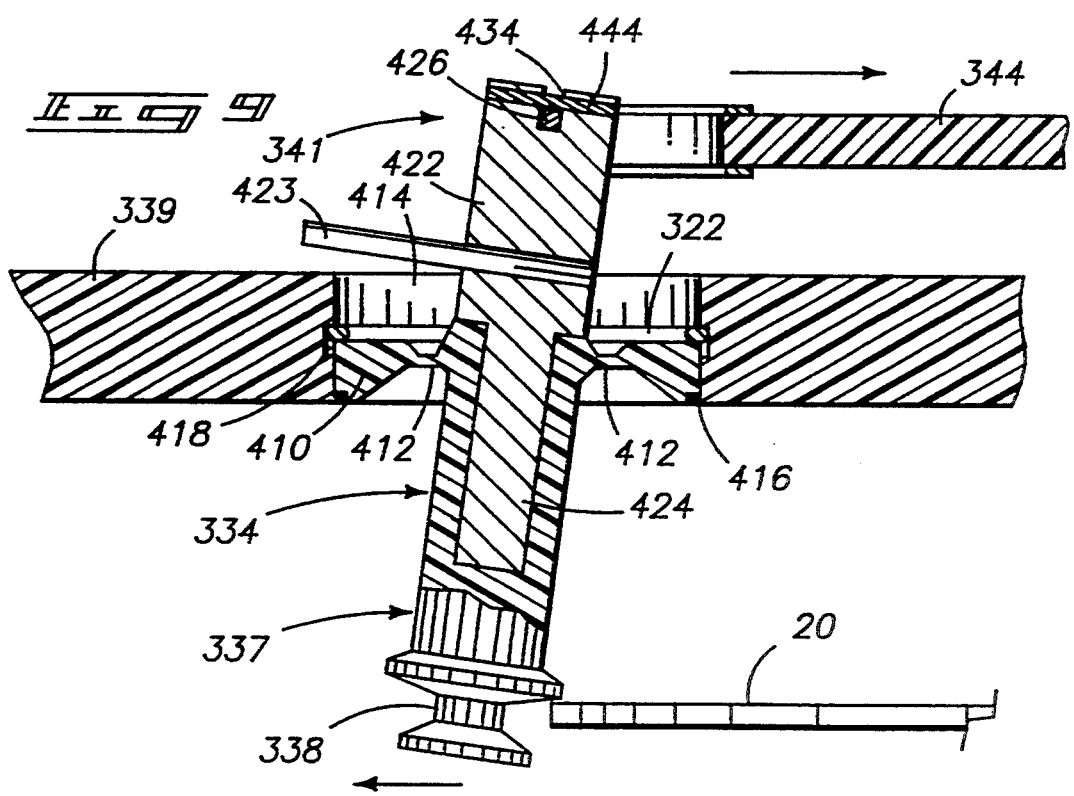

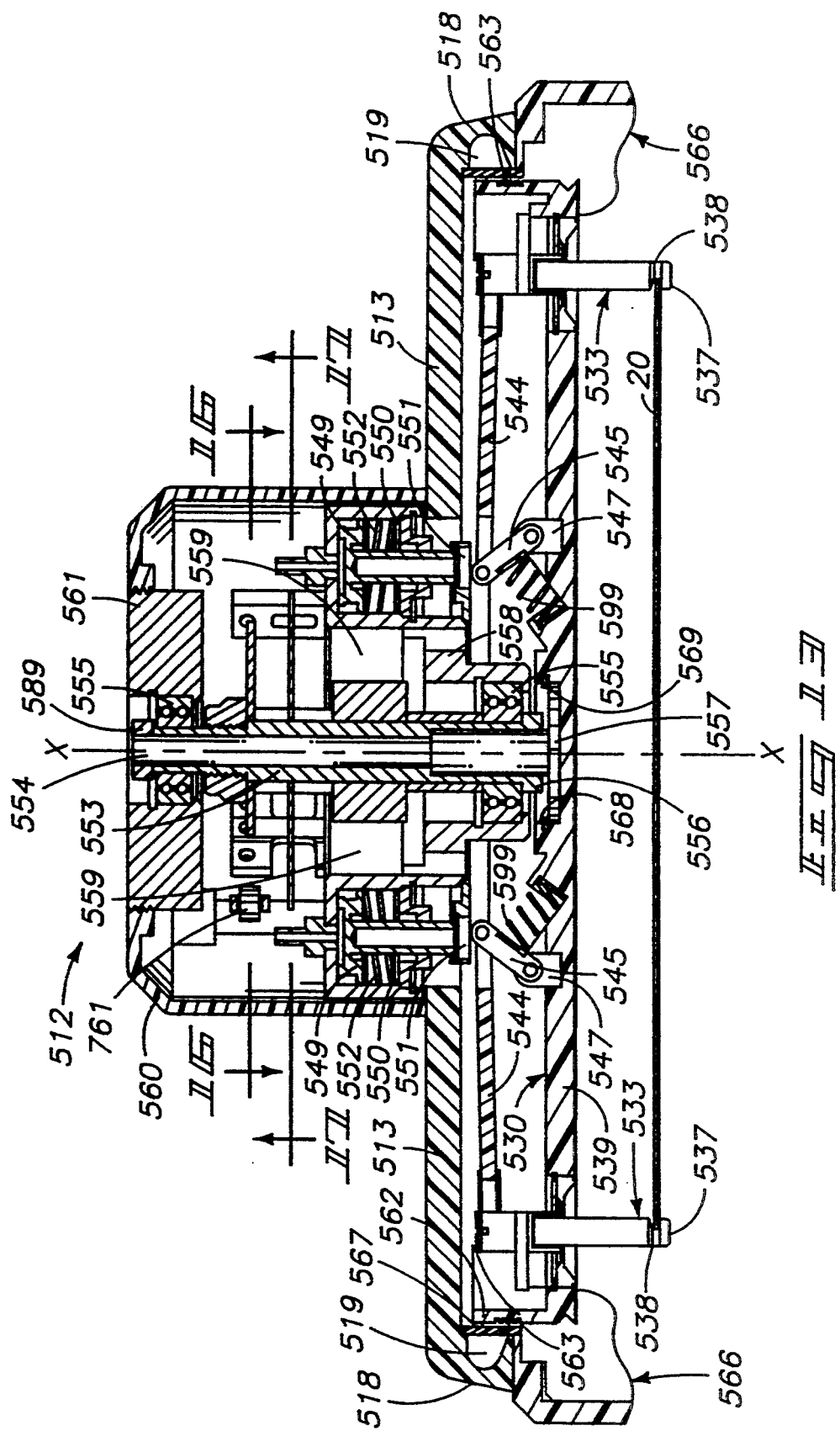

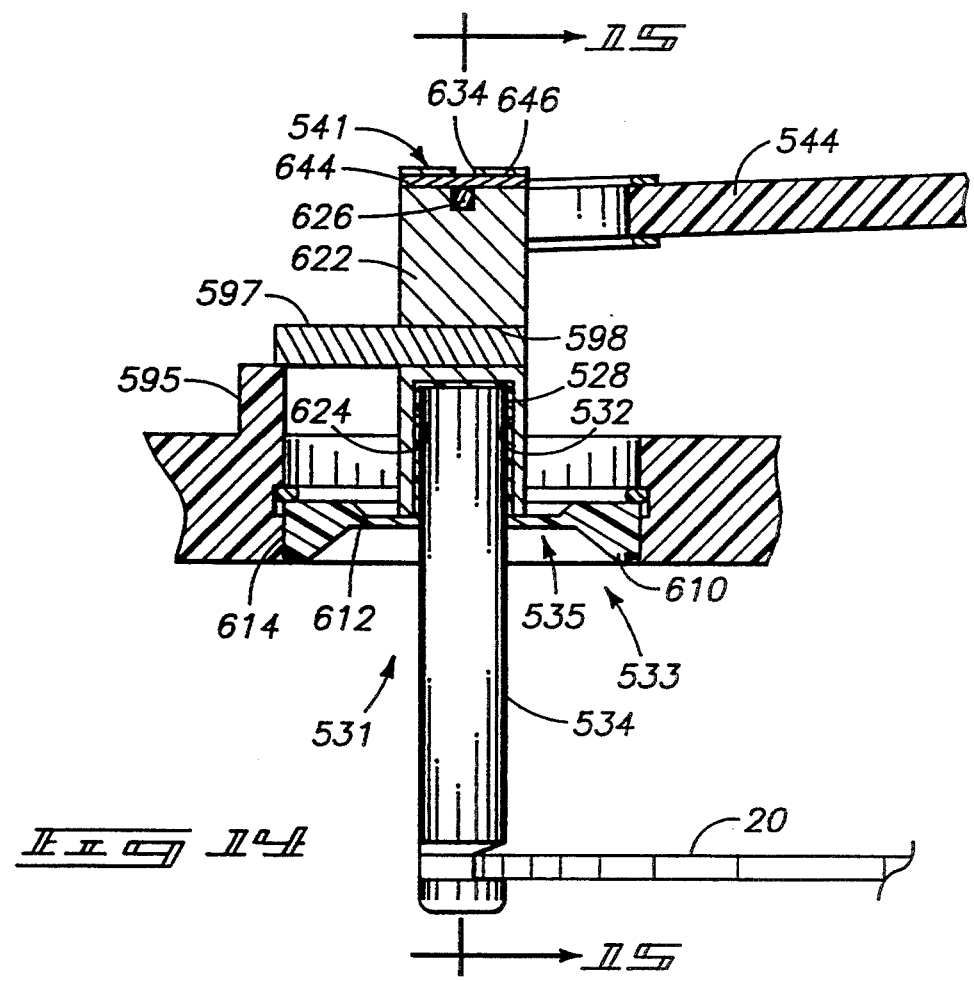
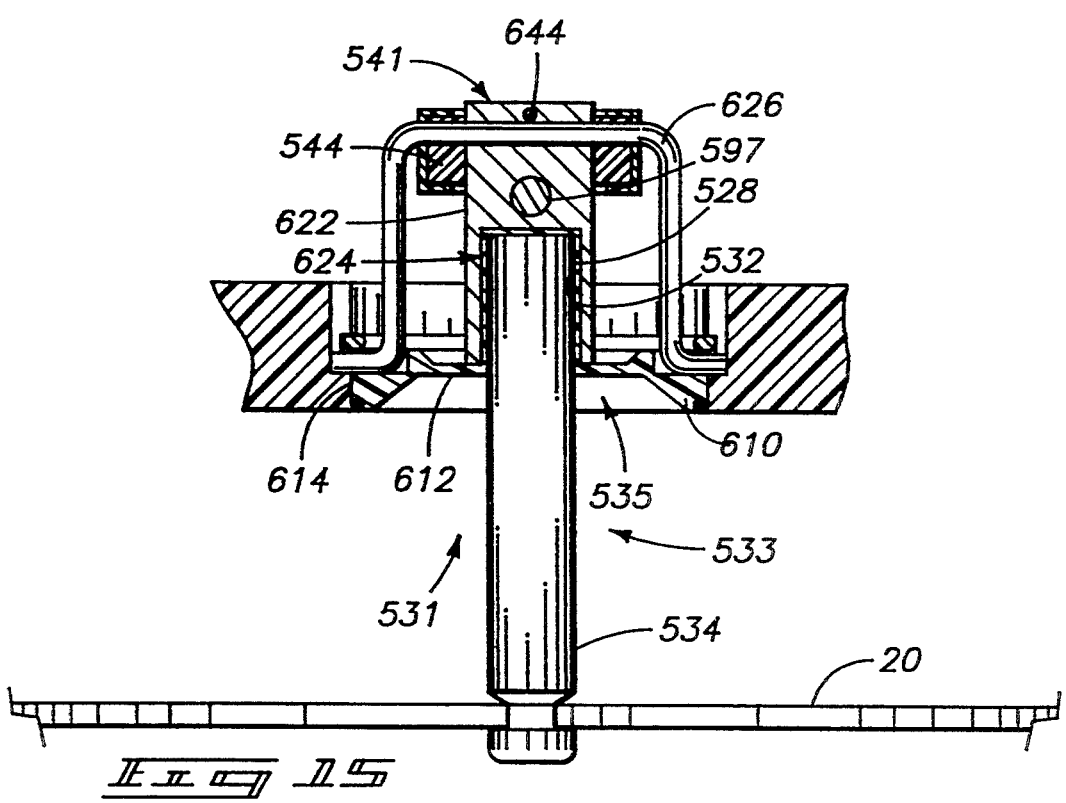

SEMICONDUCTOR PROCESSOR WAFER HOLDER

CROSS-REFERENCES TO RELATED APPLICATIONS

This is a continuation-in-part of application Ser. Nos. 07/665,609, now abandoned, 07/665,942, now U.S. Pat. No. 5,235,995, and 07/665,945, now U.S. Pat. No. 5,232,511, all filed Mar. 6, 1991.

This is also a continuation-in-part of application Ser. No. 07/526,243 filed May 18, 1990.

This is also a continuation-in-part of U.S. patent application Ser. No. 07/328,888 filed Mar. 27, 1989, now U.S. Pat. No. 5,168,886; which in turn was a continuation-in-part of U.S. patent application Ser. Nos. 07/198,732, filed May 25, 1988, now abandoned.

TECHNICAL FIELD

The technical field of this invention is processing equipment for semiconductor wafers and similar articles.

BACKGROUND OF THE INVENTION

Semiconductor wafers, substrates, magnetic disks, optical disks, flat panel display components and the like are examples of wafers which are often prepared using a sequence of chemical or photochemical processing steps. These processing steps are frequently performed while the wafer is moving, particularly rotating. Rotating or spinning a wafer during processing promotes uniform application of chemicals, whether such chemicals are applied in liquid or gaseous form, and accelerates drying of the wafer. Spinning is also useful in the application of heated gases for even drying. Accordingly, wafer processing heads have been designed to grasp a wafer along peripheral edges and to spin it about a central axis.

One type of wafer holder utilizes one or more gripping fingers which are deflected into relatively spaced or open positions. The wafer is then loaded by positioning it between the fingers. The deflected fingers are then contracted inwardly to engage the wafer along the periphery.

The wafer gripping fingers can be mounted in a rotor plate of a processing head, or other support member, using a laterally extending mounting flange connected to the core of the finger. The flange connection is advantageously by a diaphragm structure having a relatively thin annular web or septum which provides the flexibility which allows deflection of the finger by an actuating mechanism. Operation of the fingers can lead to weakening of the septum. This can cause positioning changes and erratic finger positioning over time. Such erratic positioning is problematic generally and particularly in automated wafer handling systems which feed and remove the wafers from the processor using robotic arms or other mechanisms which rely upon precise positioning. Failures of the wafer gripping fingers have also been experienced in part due to axial loading of the thin septa of the wafer finger mounting flanges. This causes equipment shutdowns and lost production time.

Accordingly, there is a need in the art for an improved wafer processor having a wafer holding and support construction which includes angularly displaceable wafer engagement fingers which have improved life and positional reliability.

BRIEF DESCRIPTION OF THE DRAWINGS

One or more preferred forms of the invention are described herein with reference to the accompanying drawings. The drawings are briefly described below.

FIG. 1 is a top view of a preferred embodiment of wafer processing head according to this invention.

FIG. 2 is a side view of the processing head of FIG. 1.

FIG. 3 is a bottom view of the processing head of FIG. 1.

FIG. 5 is a sectional view of a wafer gripping finger of the processing head shown in FIG. 1 taken along line 5—5 of FIG. 3.

FIG. 6 is a sectional view of a wafer support mechanism included in the processing head shown in FIG. 5 and taken substantially along line 6—6 thereof.

FIG. 7 is an exploded perspective view showing the wafer support mechanism shown in FIG. 5.

FIG. 8 is a sectional view of the wafer support mechanism of FIGS. 5-7 with a wafer gripping finger thereof in a contracted position to engage a wafer.

FIG. 9 is a sectional view similar to FIG. 8 with the wafer gripping finger in an expanded position to release a wafer.

FIG. 13 is a sectional view of an alternative preferred embodiment of wafer processing head according to this invention.

FIG. 14 is a sectional view of a wafer gripping mechanism used in the processing head of FIG. 13.

FIG. 15 is a sectional view of the wafer gripping mechanism taken along line 15—15 of FIG. 14.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 4:
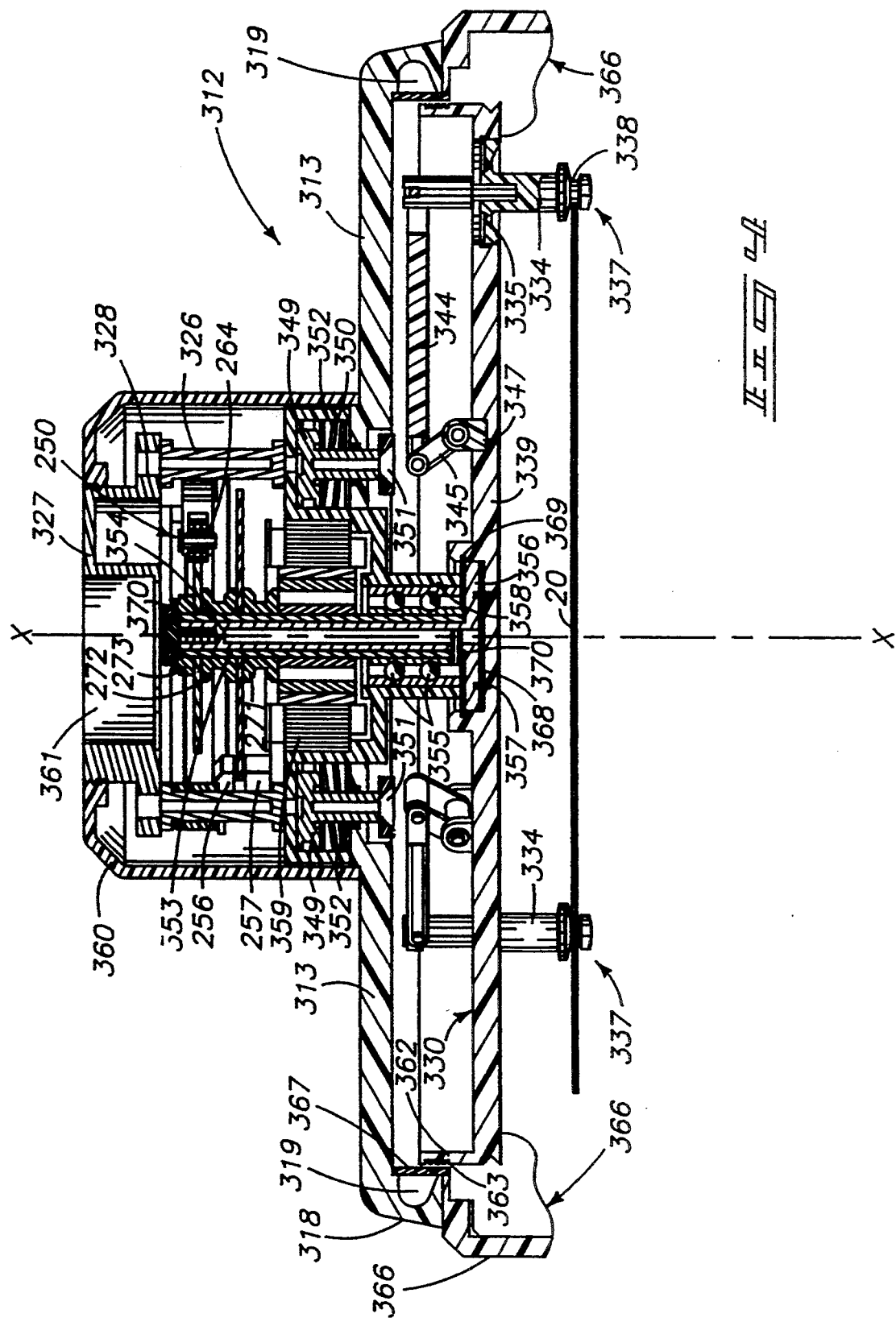
FIG. 4 is a sectional view of the wafer processing head of FIG. 1 taken substantially along line 4—4 of FIG. 1.

FIGS. 1-3 generally show a wafer processing head 312 according to this invention. Processing head 312 is advantageously designed to mate with a processing bowl to form a substantially enclosed processing chamber for processing wafers. A portion of a suitable processing bowl is shown in FIG. 4 and generally referenced by the numeral 366. The particular processing bowls used can be constructed in a variety of ways to accomplish the particular type or variety of processing steps desired.

Wafer support head 312 generally comprises a main cover piece or shroud 313 which is roughly disk-shaped and constitutes the main structural piece of the head. The outer edge of cover 313 is down-turned to form a rim 318. Rim 318 has an inwardly directed annular recess 319 through which purge gasses can advantageously be supplied. A ring-shaped band piece 367 extends along and covers the inside of recess 319 to define a conduit therewith. A series of small purge nozzles pass the purge gas from recess 319 inwardly toward flange 362. Cover 313 is also provided with a central opening through which a motor support 358 is received. The cover is advantageously made of polyvinylidene fluoride or other suitable acid-resistant material.

The processor head assembly 312 also includes a cap 360 which covers a drive assembly which will be described more fully below. The upper end of cap 360 is threadably mounted by a cap mount 327 which is supported by spacers 326 upon the motor support 358. Spacers 326 have interior bores which receive fasteners (not shown) which extend through apertures 328 formed through the cap mount 327. Within the top of cap 360 is a tool connection receptacle 361 formed by the cap mount 327 which is a convenience feature utilized for lifting and supporting the head assembly, such as in maintenance or in other processing equipment applications.

Processor head 312 also includes a wafer holder or support 330. Wafer support 330 is movably mounted to remaining parts of the head assembly to provide rotation or other appropriate relative motion between the wafer being processed and processing chemicals.

The wafer support includes a wafer support member, such as the disk-shaped wafer support plate 339. Wafer support plate 339 has an exposed front face which is typically downwardly directed as shown. Wafer support plate 339 also has a back face which is upwardly directed as shown and removed from wafer 20. The wafer support plate 339 is advantageously constructed of polyvinylidene fluoride with an upturned lip 362 about the periphery thereof. Lip or flange 362 can advantageously be provided with outwardly facing parallel grooves 363 to help restrict gas flow between lip 362 and the adjacent piece 367 forming the interior surface of the cover assembly.

Wafer support plate 339 mounts one or more wafer engaging fingers to hold a wafer in proper position for processing. As shown support plate 339 includes a plurality of wafer gripping mechanisms 334, such as the triad shown, or more. Wafer gripping finger assemblies 334 have distal ends 337 which extend outwardly, such as downwardly as shown, from the front face of wafer support plate 339. Distal ends 337 of the fingers are preferably adapted and formed to provide annular gripping notches or grooves 338 into which are received the edges of wafer 20. The gripping fingers of assemblies 334 are laterally and radially positioned so that gripping grooves 338 engage and support wafer 20 about its periphery. Distal ends 337 of gripping fingers 334 are spatially contracted toward one another to hold wafer 20, or expanded outwardly to release the wafer, as shown in FIGS. 8 and 9, respectively.

FIGS. 5–7 show a preferred construction for wafer engaging or gripping finger assemblies 333. The assemblies have core portions 334 which include wafer gripping fingers which extend from the support plate. Each wafer engaging finger assembly also includes a mounting flange 335 connected to the central core 334. The mounting flange 335 is connected to the central core 334, most preferably by integrally forming these parts. Mounting flange 335 is most preferably disk-shaped, having a circularly annular outer mounting ring 410 and a relatively thin and flexible inner flange web or septum 412.

Wafer gripping finger assembly 334 is constructed and appropriately mounted to wafer support plate 339 to provide a pliant central core which can be displaced angularly as indicated by FIGS. 8 and 9. This pliancy provides the necessary relative expansion and contraction between multiple wafer engaging fingers to allow for controlled gripping and release of wafer 20. The pliancy is preferably provided by mounting the central finger portion or core 334 of the finger assembly within a flexible diaphragm formed by the mounting flange 335. The mounting flange diaphragm is more specifically rendered flexible by the inclusion of the relatively thin web or septum 412. Septum 412 is connected to longitudinally medial portions of the central core of the finger assembly. This is preferably done using an enlarged inner flange or boss 413. The septum and connected mounting flange 335 limit lateral movement of the central core while allowing desired angular displacement as forced by movement of an actuator link 344. The annular septum 412 is preferably integrally formed with the central core of the finger assembly and mounting ring 410. Mounting flange 335 is preferably made of a relatively flexible material, such as a synthetic polymer. For most applications the finger assembly 333 is made of TEFLON® or other material suitable for service in the corrosive or other chemical environment to which the part is subjected.

Wafer support plate 339 has mounting receptacles 414, each of which receives a finger assembly 333. The mounting receptacles 414 are in part defined by bores 415 forming the sidewalls of the receptacles. Each mounting receptacle 414 is preferably provided with a flange retaining shoulder 416 near the front face of wafer support plate 339. Retaining shoulder 416 has a diameter which is smaller than remaining portions of mounting bore 414 and sufficiently small in size to axially support the outer portions of the ring 410 of finger assembly mounting flange 335. This construction provides axial support and positioning against downward motion for mounting flange 335 and the associated finger assembly.

Bore 415 is also preferably adapted to engage a detachable retainer for securing the finger assembly within the mounting receptacle. Bore 415 advantageously includes a retainer receiving groove or retainer ring seat 418. As shown, the retainer ring seat 418 is formed as a circumferential groove along the interior wall of each receptacle of wafer support plate 339. Retainer seat 418 is formed at an axial position near but slightly above the upper face of mounting ring 410. A finger assembly detachable retainer, such as retaining ring or snap ring 322 is removably received within ring seat 418. Retainer seat 418 and retaining ring 322 are axially positioned, sized and constructed to securely hold the mounting flange 335 in position against the retaining shoulder 416.

Wafer gripping finger assembly 333 has an upper or proximal end finger core extension 341 which extends the finger core 334 upwardly and provides a suitable part for connection with the pivot control and actuator mechanisms which are described in greater detail below. The finger core extension is preferably constructed of a suitably durable material for mechanical engagement. As shown, it is preferably made of a stainless steel or other corrosion resistant metal. The core extension 341 extends upwardly adjacent the back face of wafer support plate 339. The core extension is preferably formed as a shaft having a head 422 and a reduced sized insertion post 424 on its lower end. The head and post are advantageously cylindrical. Post 424 is received within a finger core post receptacle 425 which extends partially into the finger piece 334 toward distal end 337.

FIG. 5 shows that a pivot stop is preferably provided to limit the angular displacement of the finger core. This is advantageously accomplished using a core stop member 423. Core stop member 423 is advantageously a pin which is mounted in an associated stop member aperture formed in the core extension 341. The outboard end of the core stop member bears upon a stop when the finger core is in the contracted position. The stop is provided by the back surface of the wafer support plate 339.

The upper or proximal end of core extension 341 is preferably provided with an actuator connection feature, such as a proximal end transverse groove or slot 434. Adjacent to slot 434 is a proximal end retainer, advantageously in the form of a rolled pin 444 received through distal end retainer aperture 446. Aperture 446 is formed transverse to and intersecting upper portions of slot 434.

As shown, proximal end slot 434 receives a pivot control member 426 therethrough. The pivot control member serves dual functions. One function is as a connection pin which connects between the actuator member 344 and the finger assembly 333 via core extension 341. The other function is as a pivot control which reduces or eliminates axially loading of the finger assembly core. This is done by supporting the proximate end of the finger core and connected actuator member 344 using a swing arm pivot supported upon the wafer support member 339, as is described in greater detail below.

The pivot control 426 advantageously is in the form of a U-shaped bail or swing arm pivot assembly having two corresponding and complementary sides. The sides of the preferred U-shaped pivot control include pivot arms or links 432 having first ends 430 which define the pivot points or fulcrums about which the pivot arms move with respect to the support plate 339. A connecting bar section 431 extends between the pivot control assembly side or swing arms 432.

Each pivot swing arm 432 has a fulcrum end 438 pivotally mounted to support plate 339. The fulcrum ends are advantageously mounted within pivot arm mounting pockets or mounts 440 appropriately formed as longitudinal grooves in the sidewalls of the receptacles 414. Longitudinal grooves 440 are upwardly open to receive the pivot arm fulcrum ends 438. Additionally, the upper or proximate face of mounting ring 410 of mounting flange 335 has upwardly open lateral grooves 442 against which the fulcrum ends bear. The fulcrum ends are also held in position by retaining ring 322. This construction provides secure but pivotal mounts for the pivot control assembly 426.

The pivot axis defined by this mounting of the pivot control assembly lies substantially in the same plane as the mounting flange 335, approximately within the plane of septum 412. This construction aligns the pivot axis of the pivot control assembly with the natural angular deflection axis of the finger assembly core provided by the flexibility of the septum and connected parts of the mounting flange.

The pivot control 426 provides relatively rigid vertical or axial support for gripping finger core 334 while allowing substantially free angular displacement of the core by actuator link 344. This reduces the axial stress which otherwise is imposed on the flexible diaphragm septum 412, and reduces or eliminates the requirement that mounting flange 335 carry the load applied through actuator link 344.

The processing head further includes finger actuators for pivoting the finger assembly cores into expanded and contracted positions. FIG. 4 shows a preferred means for actuating the gripping fingers. Each finger assembly has an associated actuator bar or elongated connecting link 344. The actuator links each have an outer or first end which is operatively connected near proximal end 341 of wafer gripping finger core 334. This connection is preferably constructed as more specifically described below. Actuation link 344 moves proximal end 341 to angularly displace or pivot the core 334 of the wafer gripping finger assemblies 333, causing distal end 337 to be laterally displaced in the opposite direction. FIGS. 8 and 9 show the contracted and extended positions assumed by the distal ends of the fingers, respectively.

FIG. 4 also shows that a radially inward or second end of elongated actuator link 344 is pivotally connected to a remote end of an actuator positioning link 345. The opposite or mounted ends of positioning link 345 is pivotally connected to the wafer support plate 339 using positioning link brackets 347. The positioning links 345 are oriented at oblique angles extending inwardly from the pivotal connection with the mounting bracket 347 to the remote end and the pivotal connection with elongated link rod 344. The mounting bracket 347 can be provided with a biasing spring (not illustrated) which urges link 345 upwardly and the associated wafer finger 333 into contracted positions tending to grip the wafer (see FIG. 8).

The distal ends of the wafer gripping finger cores 334 are moved into expanded positions to release the wafer by displacing the pivotal joints between elongated links 344 and positioning links 345 downwardly and inwardly. This causes the elongated links 344 to move inwardly in a radial direction to displace tile proximal ends of the wafer fingers inwardly and the opposite distal ends outwardly to release the wafer (see FIG. 9). The elongated links are displaced downwardly and inwardly by an annular contact ring 351. Contact ring 351 is operated by a pair of small pneumatic pistons 349. Pistons 349 are slidable within cylindrical piston cylinders 350 formed in motor support 358. Pressurized fluid is supplied to the upper sides of pistons 349, as shown in FIG. 4, to force them downwardly and cause contact between annular contact ring 351 and positioning links 345. The pistons are returned by return springs 352 mounted within the piston cylinders.

The outer end of the elongated actuator link 344 is preferably attached to tile connecting bar portion 428 of pivot control member 426. More specifically, link 344 has a yoke 450 at its outer end which fits about the proximal end 341 of the finger extension 422. Yoke 450 has opposed arms 452 which include slotted apertures 454. Apertures 454 are collinear bores having side openings which extend downwardly and allow the connection bar portion 431 of the pivot control to snap-fit thereinto.

The connection bar 431 is held in position within apertures 454 using an actuator connection lock 457. The actuator connection lock 457 is in part provided by the snap-fit between the connection bar 431 and the apertures 454. The lock also includes a lock slide piece or retaining clip 456 which is slidably mounted upon the end of the actuator link 344. Retaining clip 456 is received over elongated link 344 to form a collar. Retaining clip 456 has opposed arms 458 which complement the opposed arms 452 of the yoke 450 when the retaining clip 456 is slid into the locking position. In the locking position the slotted locking clip apertures 460 snap-fit over the connecting bar portion 431 of the pivot control member 426. This construction secures the connection bar to the end of the actuator link 344.

To fasten or clip elongated link 344 to pivot member 426, retaining clip 456 is slid back into the retracted position indicated in FIG. 7 to clear actuator link apertures 454. The apertures 454 are then snapped over the connecting bar portion 43 1 of the pivot control member. Retaining clip 456 is then slid to engage the slotted locking clip apertures 460 over the connecting bar 431. The apertures 460 snap fit over connecting bar 431 to retain the locking clip 456 in position.

FIG. 4 shows the wafer support drive assembly includes a motor 359 which is mounted upon motor support 358. Motor 359 is preferably a brushless DC motor. Motor 359 has a hollow motor shaft 353 supported by a set of ball bearings 355. The hollow motor shaft 353 receives a detachable shaft 354 therethrough. The detachable shaft 354 is axially splined to the motor shaft using a spline pin 370 captured between a flanged shaft head 356 and the end of the motor shaft 353. The upper end of the detachable shaft is adapted for receiving a small screw 370 which pulls the two shafts into a tightened and anti-rotationally splined assembly. The flanged head is received within a shaft head receptacle 368 formed in the back surface of wafer support plate 339. Spaced, axially oriented, anti-rotation pins 357 are engaged between the lower face of tile flanged shaft head 356 and corresponding holes formed in receptacle 368. A snap-ring retainer 369 holds the flanged head 356 axially within receptacle 368.

The angular positions of fingers 333 about the rotating assembly rotational axis X—X are preferably controlled to assume desired positions when the rotatable wafer support 330 stops. This indexing of the stationary positions of fingers 333 is needed when the processing head is opened to provide proper engagement of the wafer.

Figure 10:
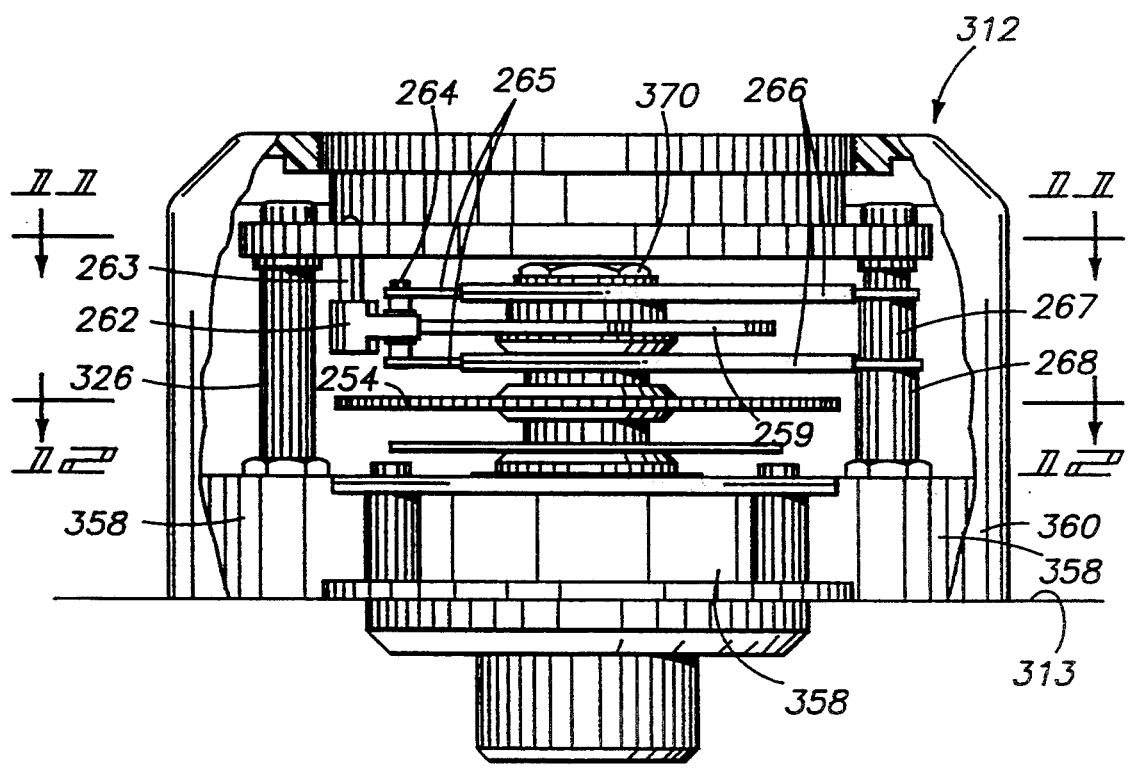
FIG. 10 is a side view partially broken away of upper portions of the wafer processing head of FIG. 1, showing a preferred indexing means.
Figure 11:
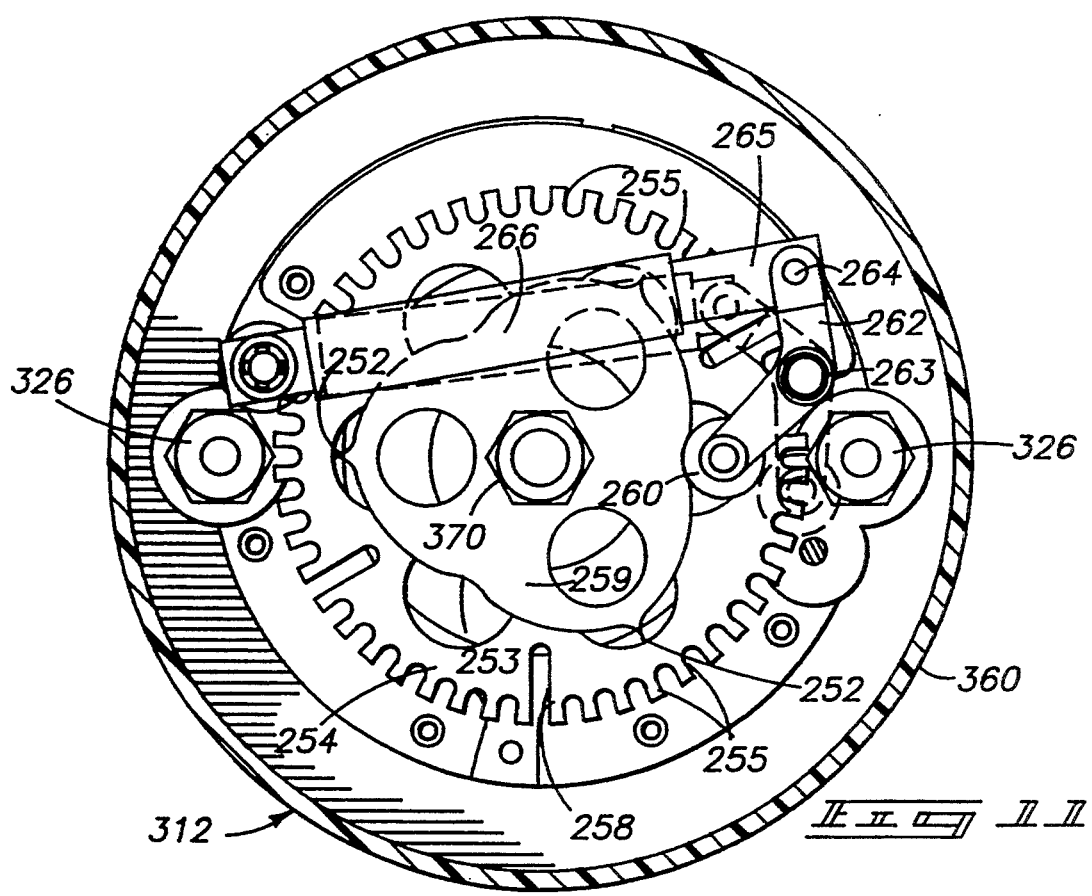
FIG. 11 is a sectional top view of the preferred indexing means of FIG. 10 taken along line 11—11 of FIG. 10.

FIGS. 10 and 11 show a preferred indexing means 250 used to position the wafer support, motor and other rotatable parts forming the rotating assembly of the processing head drive. Rotor positioning or indexing mechanism 250 includes a multi-sided cammed rotor plate 259 mounted to rotate with motor shaft 353 using shaft spacers 271, 272 and 273 held between the motor and end nut 370. The cam plate 259 has a plurality of sides equal in number to the number of finger assemblies 383. Each side of rotor plate 259 has a curved edge configuration (shown in FIG. 11). The curved configurations of each of the three side segments are sloped relative to a circle defined by axis X—X. The curves slope from high points 252 at the adjoining ends of the side segments toward central low points 253. The central low points serve as a detent when engaged by an edge engagement roller 260 which is controllably forced inward. When motor 359 is inoperative and drive shaft 38 is freely rotatable, the inward force of roller 260 causes rotor plate 259 to pivot to bring the rotating assembly into an angular position which centers roller 260 within a low point 253 of the cammed rotor plate, as shown in FIG. 11.

Roller 260 is mounted at one end of a crank arm 262. Crank arm 262 is pivotally supported on a supporting shaft 263 depending from the cap mount 327. The opposite end of crank arm 262 includes a pivotal connection 264 at which are joined the outer ends of two parallel pneumatic piston rods 265 that are part of two parallel pneumatic ram assemblies 266. The remaining ends of the rams 266 are pivotally mounted in parallel using spacers 267 and 268 which extend over spacer shaft 326.

The pneumatic rams 266 are normally spring biased into retracted positions wherein roller 260 is radially clear of the cammed rotor plate 259. When the rotor assembly stops rotation and indexing of the wafer support plate 339 is desired, the small pneumatic rams 266 are extended to force roller 260 radially inward against the edge of rotor plate 259 to thereby position the rotor as shown in FIG. 11. The detent assures that the fingers 333 are angularly indexed when stationary to thereby meet operational requirements of associated wafer transfer equipment.

Figure 12:
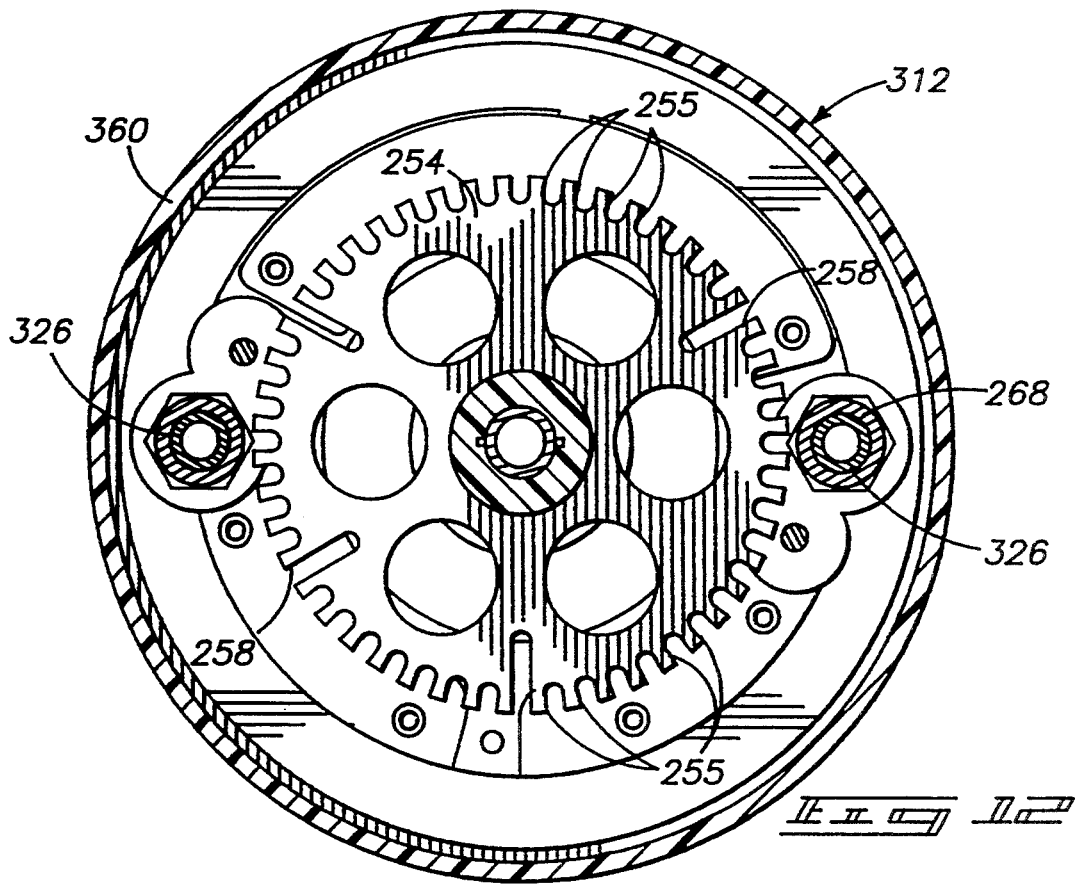
FIG. 12 is a sectional view of the wafer processing head of FIG. 1, taken along line 12—12 of FIG. 10.

A motion monitoring assembly is also advantageously provided within processing head 312 for measuring the speed and direction of rotation of the wafer plate 330 about the rotational axis X—X. The motion monitoring assembly includes a rotor indicating element such as rotor indicator disk 254, best shown in FIG. 12. Indicator disk 254 is provided with a series of peripheral notches 255 which intermittently pass and interrupt two radially spaced optical beams. FIG. 4 shows optical emitter 256 and optical detector 257 between which the optical beams pass. The large notches 258 are utilized to provide confirmation of the proper stationary positioning of the rotating assembly. The inclusion of one asymmetric large notch also allows direction of rotation to be determined. The small notches 255 interrupt the radially outward optical beam to provide an indication of angular speed.

FIGS. 13-17 show an alternative wafer processing head 512 according to this invention. Processing head 512 has exterior features similar to the embodiment described above for mating with a suitable processing bowl 566, a portion of which is shown in FIG. 13.

Wafer support head 512 includes a main cover piece or shroud 513 which is roughly disk-shaped and constitutes the main structural piece of the head. The outer edge of cover 513 is down-turned to form a rim 518. Rim 518 has an inwardly directed annular recess 519 through which purge gasses can advantageously be supplied. A ring-shaped band piece 567 extends along and covers the inside of recess 519 to define a conduit therewith. A series of small purge nozzles pass the purge gas from recess 519 inwardly toward flange 562. Cover 513 is also provided with a central opening through which a motor support 558 is received. The cover is advantageously made of polyvinylidene fluoride or other suitable acid-resistant material.

The processor head assembly 512 also includes a cap 560 which covers a drive assembly that is described more fully below. Processor head 512 also includes a wafer holder or support 530. Wafer support 530 is movably mounted to remaining parts of the head assembly to provide rotation or other appropriate relative motion between the wafer being processed and processing chemicals.

The wafer support includes a wafer support member, such as the disk-shaped wafer support plate 539. Wafer support plate 539 has an exposed front face which is typically downwardly directed as shown. Wafer support plate 539 also has a back face which is upwardly directed as shown and removed from wafer 20. The wafer support plate 539 is advantageously constructed of polyvinylidene fluoride with an upturned lip 562 about the periphery thereof. Lip or flange 562 can advantageously be provided with outwardly facing parallel grooves 563 to help restrict gas flow between lip 562 and the adjacent piece 567 forming the interior surface of the cover assembly.

Wafer support member 539 mounts one or more wafer engaging fingers to hold a wafer in proper position for processing. As shown support plate 539 includes a plurality of wafer gripping mechanisms or assemblies 533. As shown, there are four wafer gripping finger assemblies 533. Wafer gripping assemblies 533 have fingers 534 with distal ends 537. The distal ends 537 extend outwardly from the front face of wafer support plate 539. Distal ends 537 of the fingers are preferably adapted and formed to provide gripping notches or grooves 538 into which are received the edges of wafer 20. Gripping finger assemblies 533 are laterally and radially positioned so that gripping grooves 538 engage and support wafer 20 about its periphery. The distal ends of gripping fingers 534 are spatially contracted toward one another to hold wafer 20, or expanded outwardly to release the wafer in the same general manner as explained above in connection with the first embodiment.

FIGS. 14 and 15 show the wafer engaging or gripping finger assemblies 533 in greater detail. The assemblies have cylindrical finger elements 534 which form wafer gripping fingers that extend from the support plate 539. Wafer support member 539 has mounting receptacles 614, each of which receives a finger assembly 533. Mounting receptacles 614 and the manner of securing the finger assemblies within receptacles 614 have already been described with regard to the embodiment shown in FIGS. 5–7 and will not be further described here.

Each wafer engaging finger assembly 533 includes a mounting flange 535. Mounting flange 535 is most preferably disk-shaped with a circularly annular outer mounting ring 610. A relatively thin and flexible inner flange web or septum 612 forms a part of the flange and connects to a central core 531. The central core assembly 531 is pliantly mounted relative to the support plate 539 and mounting flange 535. This pliant mounting is preferably in the form of a flexible diaphragm which is provided by the thin septum 612 and its structural relationship within the mounting flange. This pliancy provides the necessary relative expansion and contraction between multiple wafer engaging fingers to allow for controlled gripping and release of wafer 20. Septum 612 is connected to longitudinally medial portions of the central core assembly. The septum and connected mounting flange 535 limit lateral movement of the central core while allowing desired angular displacement as forced by movement of an actuator link 544. Mounting flange 535 is preferably made of a relatively flexible material, such as a synthetic polymer. For most applications the finger assembly 533 is made of TEFLON ® or other material suitable for service in the corrosive or other chemical environment to which the part is subjected.

The central core assembly 531 is advantageously constructed to include a finger element 534 which is a separate piece that can be controllably detached from the remaining portions of the central core assembly. The preferred core assembly construction includes a core receptacle 532. Core receptacle 532 is defined by a core cup 528. The preferred core cup 528 is integrally formed from the same piece as flange 535 and associated septum 612. This provides a continuous mechanical barrier from the outer periphery of the mounting ring 610 inwardly. This integral construction of the flange and cup reduces or prevents migration of corrosive chemicals from the front to the back side of wafer support plate 539.

The core cup receptacle 532 is sized to receive the finger element 534 in snug fitting relationship. The inside dimensions of the receptacle 532 are complementary to tile outer dimensions of finger element 534 to frictionally receive tile finger element therein. The proximate end of the finger element is effectively locked into position within receptacle 532 using a suitable finger element locking structure. The locking function is preferably provided in the form of finger core extension 541. The finger core extension has an end bore 624 which is sized to receive the outer portions of the core cup 528. The inside dimensions of bore 624 are slightly smaller than the outside dimensions of core cup 528. Installation of tile core extension bore over the cup causes the cup to be compressed about the inserted proximal end of finger piece 534. This locks the finger piece into position but allows controlled detachment and disassembly for maintenance or other purposes. The finger elements 534 are advantageously made of silicon carbide.

The upper or proximal end finger core extension 541 extends the finger core 534 upwardly and provides a suitable part for connection with the pivot control and actuator mechanisms. The finger core extension is preferably constructed of a suitably durable material for mechanical engagement, such as a stainless steel or other corrosion resistant metal. Core extension 541 extends upwardly from mounting flange 535 adjacent the back face of wafer support plate 539. The core extension is preferably formed as a shaft having a head 622 and the open bore 624 on its lower end for engagement with cup 528. The head and bore are advantageously cylindrical.

The upper or proximal end of core extension 541 is preferably provided with an actuator connection feature, such as a proximal end transverse groove or slot 634. Adjacent to slot 634 is a proximal end retainer, advantageously in the form of a rolled pin 644 received through distal end retainer apertures 646. Apertures 646 are formed transverse to and intersecting upper portions of slot 634. The proximal end slot 634 receives a pivot control member 626 therethrough. Pivot control member 626 and its manner of attachment to core extension 541 and wafer support member 539 are identical to pivot control member 426 and its associated components as already described with reference to FIGS. 5–7. Therefore, these components will not be described again here.

The pivot control 626 provides relatively rigid vertical or axial support for gripping finger core 534 while allowing substantially free angular displacement of the core by actuator link 544. This reduces the axial stress which otherwise is imposed on the flexible diaphragm septum 612, and reduces or eliminates the requirement that mounting flange 535 carry the load applied through actuator link 544.

Finger assembly 533 also includes a stop member advantageously mounted in core extension 541 of finger assembly 533 to limit angular displacement of finger assembly 533. The stop member is a cylindrical rod 597 which extends laterally from core extension 541. A stop shoulder 595 is integrally formed in wafer support member 539 at a lateral position coinciding with the outward end of cylindrical rod 597. Cylindrical rod 597 is received within a lateral aperture 598 which extends through core extension 541.

The stop member is oriented to allow the wafer gripping finger to pivot freely away from wafer 20. However, engagement of the stop member against the stop shoulder prevents the wafer gripping finger from pivoting beyond a predetermined limit towards wafer 20 and thereby defines the contracted position of the wafer support finger. The stop member prevents excessive force from being applied to a wafer when it is gripped by the plurality of wafer gripping fingers.

The processing head further includes finger actuators for pivoting the finger assembly cores into expanded and contracted positions. FIG. 13 shows a preferred means for actuating the gripping fingers. Each finger assembly has an associated actuator bar or elongated connecting link 544. The actuator links each have an outer or first end which is operatively connected near the proximal end of wafer gripping finger core 531. This connection is preferably constructed as described above with reference to FIG. 7. Actuation link 544 moves the upper or proximal end to angularly displace or pivot the core assembly 531 of the wafer gripping finger assemblies 533, causing distal end 537 to be laterally displaced in the opposite direction.

FIG. 13 also shows that a radially inward or second end of elongated actuator link 544 is pivotally connected to a remote end of an actuator positioning link 545. The opposite or mounted end of positioning link 545 is pivotally connected to the wafer support plate 539 using positioning link brackets 547. The positioning links 545 are oriented at oblique angles extending inwardly from the pivotal connection with the mounting bracket 547 to the remote end and the pivotal connection with elongated link rod 544. A compression spring 599 is interposed between positioning link 545 and wafer support member 539. Finger return spring 599 urges link 545 upwardly and the connected wafer finger 534 into a contracted position tending to grip the wafer in concert with other wafer fingers.

The distal ends of the wafer gripping finger cores 531 are moved into expanded positions to release the wafer by displacing the pivotal joints between elongated links 544 and positioning links 545 downwardly and inwardly. This causes the elongated links 544 to move inwardly in a radial direction to displace the proximal ends of the wafer fingers inwardly and the opposite distal ends outwardly to release the wafer. The elongated links are displaced downwardly and inwardly by an annular contact ring 551. Contact ring 551 is operated by a single or pair of small pneumatic pistons 549, as shown. Pistons 549 are slidable within cylindrical piston cylinders 550 formed in motor support 558. Pressurized fluid is supplied to the upper sides of pistons 549 to force them downwardly and cause contact between annular contact ring 551 and positioning links 545. The pistons are returned by return springs 552 mounted within the piston cylinders.

FIG. 13 shows the wafer support drive assembly includes a motor 559 which is mounted upon motor support 558. Motor 559 is preferably a brushless DC motor. Motor 559 has a hollow outer motor shaft 553 supported by two sets of ball bearings 555. The hollow motor shaft 553 has a flanged shaft head 556 at its lower end. The hollow motor shaft 553 receives an inner motor shaft 554 therein. The inner motor shaft has a disk-shaped head 557 which is suitably connected to the wafer support plate 539, such as by being received and connected within the wafer support plate motor mounting receptacle 568. The disk-shaped head 557 is firmly held in this receptacle using a ring retainer 569. The upper end of the inner shaft 554 is held in position by retaining nut 589.

The angular positions of fingers 534 about the rotating assembly rotational axis X—X are preferably controlled to assume a particular desired position when the rotatable wafer support 530 stops. This indexing of the stationary position of the rotor is desired for assurance of wafer positioning when loading and unloading the processing head to provide proper and unique positional engagement of the wafer by a wafer handling paddle or other wafer handler (not shown).

Figure 16:
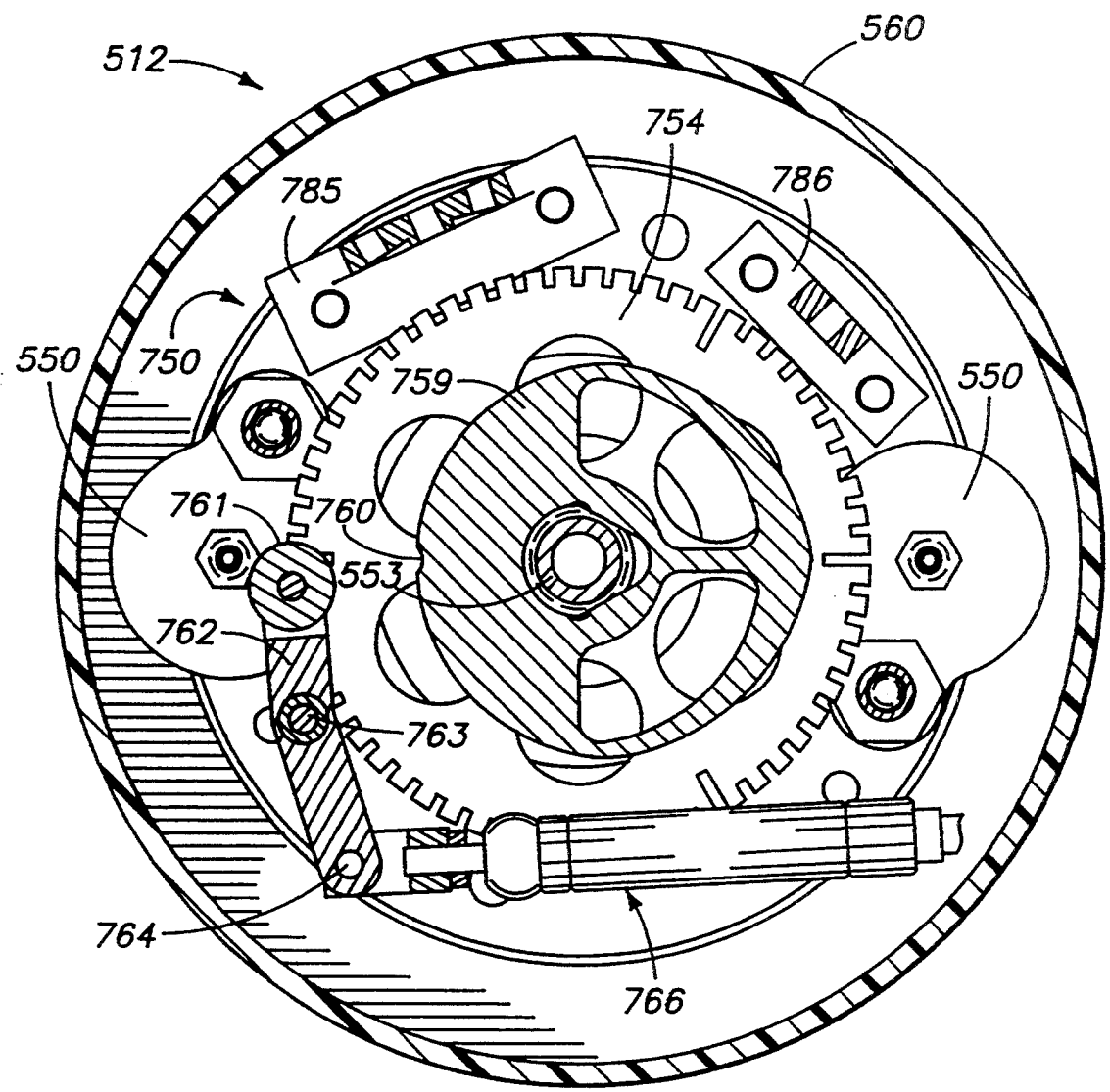
FIG. 16 is a sectional view taken along line 16—16 of FIG. 13.
Figure 17:
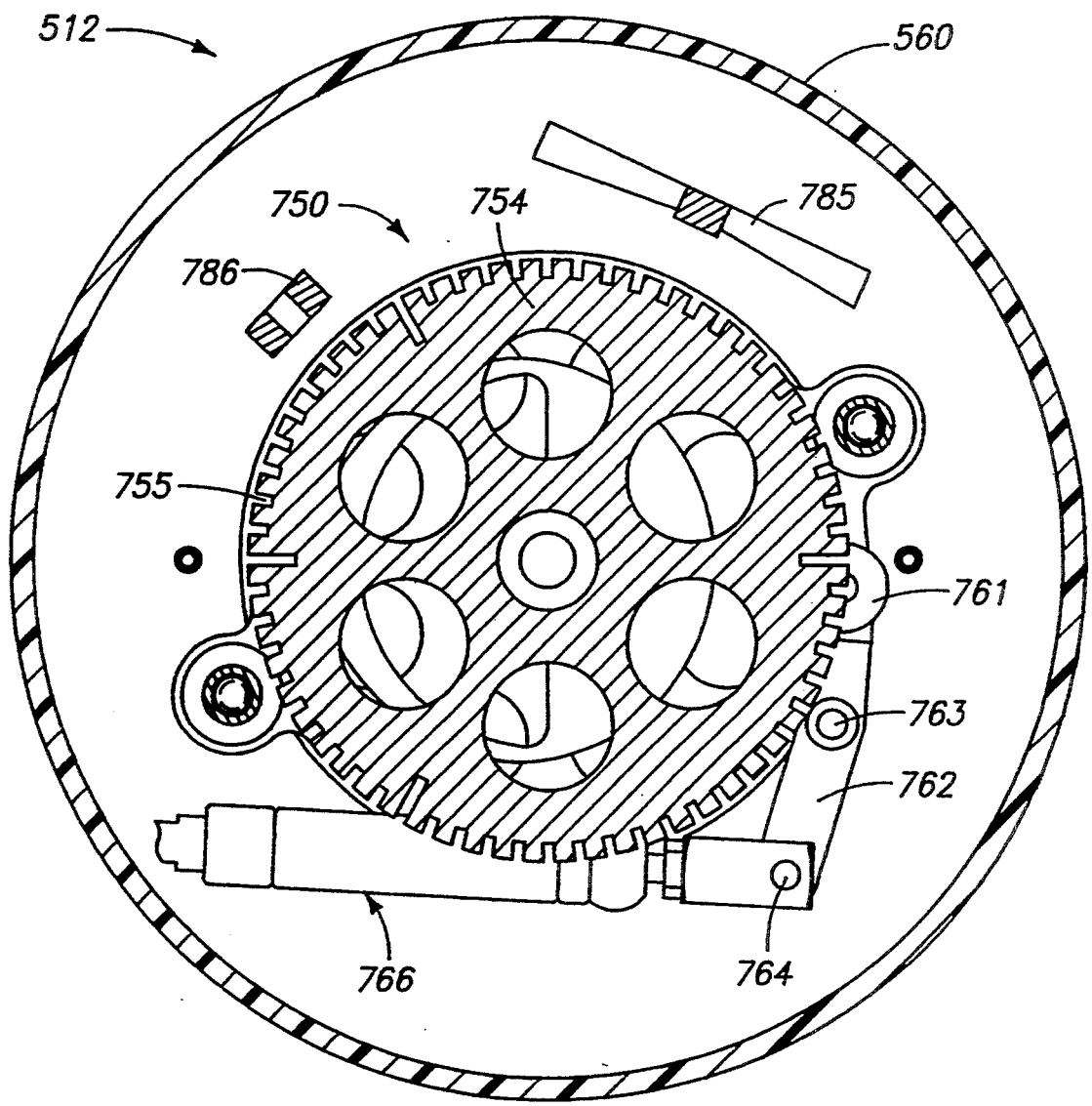
FIG. 17 is a sectional view taken along line 17—17 of FIG. 13.

FIGS. 16 and 17 show an alternative indexing means 750 used to position the wafer support, motor and other rotatable parts forming the rotating assembly of the processing head drive. Rotor positioning or indexing mechanism 750 includes a cammed rotor plate 759 mounted to rotate with motor shaft 553. The cam plate 759 has a single low point or perigee which is precisely defined by detent 760. Detent 760 allows the rotor and wafer support member to be positioned in a single desired rotational position when stopped. The outer periphery of the cam plate is sloped radially from a high point or apogee which is opposite detent 760 toward the perigee at the detent.

A roller 761 is mounted at one end of a crank arm 762. Crank arm 762 is pivotally supported on a supporting shaft 763. The opposite end of crank arm 762 includes a pivotal connection 764 at which is joined the outer end of a pneumatic ram assembly 766.

The pneumatic ram 766 is normally spring biased into a retracted position wherein roller 761 is radially clear of the cammed rotor plate 759. To index the rotating assembly the roller is extended inwardly to engage the cammed rotor plate. Roller 761 is extended by pneumatic ram 766 which pivots arm 762 upon which the roller is mounted. The roller 761 is extended inward when the rotating assembly and cam plate 759 are nearly stopped. The roller bears against the edge of rotor plate 759 to stop the rotor when roller 761 is received in detent 760. The detent assures that the fingers 534 are uniquely indexed to thereby facilitate interact/on with related wafer transfer equipment (not shown).

A rotor position and motion monitoring subsystem is also advantageously provided within processing head 512 for measuring the speed and direction of rotation of the wafer plate 530 about the rotational axis X—X. This subsystem also allows confirmation of the position of the rotor after ram 766 is extended. The rotor position and motion monitoring subsystem includes a rotor indicating element such as rotor indicator disk 754, best shown in FIG. 17. Indicator disk 754 is provided with a series of peripheral notches 755 which intermittently pass and interrupt three optical beams. The three optical beams are provided by paired emitters and detectors (not shown) which beam through the notches on disk 754. Two optical emitter detector pairs are mounted upon bracket 785. These two are aligned to intermittently pass two beams through notches 755. The two emitter detector pairs are spaced so that they are out of phase from one another by an amount which produces a different phase shift depending upon whether the direction is clockwise or counter-clockwise. The third emitter detector pair is mounted upon mounting bracket 786 and is aligned to intermittently pass through the deeper notches and confirm proper positioning after ram 766 has been extended.

The invention is used in a variety of processing applications in the manners described hereinabove. The various components are made using a variety of metal and plastic forming techniques, such as machining or molding into the parts shown and described herein.

In compliance with the statute, the invention has been described in language necessarily limited in its ability to properly convey the conceptual nature of the invention. Because of this inherent limitation of language, it must be understood that the invention is not necessarily limited to the specific features described, since the means herein disclosed comprise merely preferred forms of putting the invention into effect. The invention is, therefore, claimed in any of its forms or modifications within the proper scope of the appended claims appropriately interpreted in accordance with the doctrine of equivalents.

We claim:

1. A water processing head for holding a wafer, such as semiconductor wafers, magnetic disks, optical disks and the like, during processing, the wafer processing head comprising:
   a wafer support member;
   at least one wafer gripping finger having a proximal end and a distal end; said distal end extending to engage and support a wafer along peripheral edges thereof;
   at least one mounting flange flexibly connecting the at least one wafer gripping finger to the wafer support member to allow angular displacement of the wafer gripping finger; said at least one mounting flange including a flexible septum surrounding the wafer gripping finger:
   at least one pivot control pivotally supporting the wafer gripping finger upon the wafer support member while allowing inward and outward displacement of the distal end of the wafer gripping finger; and
   at least one finger actuator operatively connected to said at least one wafer gripping finger for moving the wafer gripping finger.

2. A wafer processing head according to claim 1 wherein the mounting flange is integrally connected with the flexible septum and with portions of the wafer gripping finger.

3. A wafer processing head for holding a wafer, such as semiconductor wafers, magnetic disks, optical disks and the like, during processing, the wafer processing head comprising:
   a wafer support member;
   at least one wafer gripping finger having a proximal end and a distal end; said distal end extending to engage and support a wafer along peripheral edges thereof;
   at least one mounting flange flexibly connecting the at least one wafer gripping finger to the wafer support member to allow angular displacement of the wafer gripping finger;
   at least one pivot control pivotally supporting the wafer gripping finger upon the wafer support member while allowing inward and outward displacement of the distal end of the wafer gripping finger; and
   at least one finger actuator operatively connected to said at least one wafer gripping finger for moving the wafer gripping finger;
   wherein the at least one pivot control member is approximately U-shaped.

4. A wafer processing head according to claim 1 wherein said at least one wafer gripping finger includes a finger extension which engages the at least one pivot control.

5. A wafer processing head according to claim 1 further wherein said at least one wafer gripping finger includes a finger element which is detachable.

6. A wafer processing head according to claim 1 wherein said at least one wafer gripping finger includes a central core having a detachable finger element.

7. A wafer processing head according to claim 1 wherein said at least one wafer gripping finger includes a central core having a finger element receptacle formed therein; said at least one wafer gripping finger also including a detachable finger element which is held in the finger element receptacle.

8. A wafer processing head according to claim 1 further comprising a stop member mounted in the at least one wafer gripping finger to limit angular displacement thereof.

9. A wafer processing head according to claim 1 wherein said at least one wafer gripping finger includes a finger extension which engages the at least one pivot control; said finger extension including a groove through which at least a portion of the pivot control extends.

10. A wafer processing head according to claim 1 wherein said at least one pivot control includes a U-shaped pivot control assembly having two arms.

11. A wafer processing head according to claim 1 wherein said at least one pivot control includes a U-shaped pivot control link assembly having two arms which pivot about a pivot control link pivot axis lying approximately within a plane about which the wafer gripping finger is angularly displaced by said at least one finger actuator.

12. A wafer processing head according to claim 1 wherein said pivot control includes two arms extending along opposing sides of the wafer gripping finger.

13. A water processing head according to claim 1 wherein said at least one finger actuator engages the pivot control.

14. A wafer processing head according to claim 1 wherein said at least one finger actuator includes a yoke which engages a U-shaped pivot control link.

15. A wafer processing head according to claim 1 wherein said at least one finger actuator includes a yoke which detachably engages a U-shaped pivot control link; and further comprising an actuator lock which controllably locks the yoke to the pivot control link.

16. A wafer processing head according to claim 1 wherein said at least one finger actuator includes a yoke which detachably engages a U-shaped pivot control link; and further comprising an actuator lock which is slidably mounted upon the finger actuator to controllably lock the yoke to the pivot control link.

17. A semiconductor wafer processing head for holding and supporting a wafer, comprising:

a wafer support member;

at least one wafer gripping finger mounted in the wafer support member; said at least one wafer gripping finger being pliantly mounted in the wafer support member for controlled angular displacement;

at least one finger actuator connected to said at least one wafer gripping finger to provide controlled angular displacement thereof;

at least one pivot control link connecting the at least one wafer gripping finger to said wafer support member to restrain axial movement of the wafer gripping finger during angular displacement by said actuator.

18. A semiconductor wafer processing head according to claim 7 wherein said at least one wafer gripping finger includes a finger extension which engages the at least one pivot control link.

19. A semiconductor wafer processing head according to claim 7 further wherein said at least one wafer gripping finger includes a finger element which is detachable.

20. A semiconductor wafer processing head according to claim 7 further comprising a mounting flange which mounts the wafer gripping finger in the wafer support member; and wherein said at least one wafer gripping finger includes a central core having a detachable finger element.

21. A semiconductor wafer processing head according to claim 7 further comprising a mounting flange which mounts the wafer gripping finger in the wafer support member; and wherein said at least one wafer gripping finger includes a central core having a finger element receptacle formed therein; said at least one wafer gripping finger also including a detachable finger element which is held in the finger element receptacle.

22. A semiconductor wafer processing head according to claim 7 further comprising a stop member mounted in the at least one wafer gripping finger to limit angular displacement thereof.

23. A semiconductor wafer processing head according to claim 7 wherein said at least one wafer gripping finger includes a finger extension which engages the at least one pivot control link; said finger extension including a groove through which at least a portion of the pivot control link extends.

24. A semiconductor wafer processing head according to claim 7 wherein said at least one pivot control link includes a U-shaped pivot control link assembly having two arms.

25. A semiconductor wafer processing head according to claim 7 wherein said at least one pivot control link includes a U-shaped pivot control link assembly having two arms which pivot about a pivot control link pivot axis lying approximately within a plane about which the wafer gripping finger is angularly displaced by said at least one finger actuator.

26. A semiconductor wafer processing head according to claim 7 wherein said pivot control link includes two arms extending along opposing sides of the wafer gripping finger.

27. A semiconductor wafer processing head according to claim 7 wherein said at least one finger actuator engages the pivot control link.

28. A semiconductor wafer processing head according to claim 7 wherein said at least one finger actuator includes a yoke which engages a U-shaped pivot control link.

29. A semiconductor wafer processing head according to claim 7 wherein said at least one finger actuator includes a yoke which detachably engages a U-shaped pivot control link; and further comprising an actuator lock which controllably locks the yoke to the pivot control link.

30. A semiconductor wafer processing head according to claim 7 wherein said at least one finger actuator includes a yoke which detachably engages a U-shaped pivot control link; and further comprising an actuator lock which is slidably mounted upon the finger actuator to controllably lock the yoke to the pivot control link.

31. A semiconductor wafer processor, comprising:

a frame;

a wafer support member mounted for movement relative to said frame;

at least one wafer gripping finger mounted in the wafer support member; said wafer gripping finger being pliantly mounted in the wafer support member for controlled angular displacement;

at least one finger actuator connected to said at least one wafer gripping finger to provide controlled angular displacement thereof;

at least one pivot control link connecting the at least one wafer gripping finger to said wafer support member to restrain axial movement of the wafer gripping finger during angular displacement by said actuator.

32. A semiconductor wafer processor according to claim 31 wherein said at least one wafer gripping finger includes a finger extension which engages the at least one pivot control link.

33. A semiconductor wafer processor according to claim 31 further wherein said at least one wafer gripping finger includes a finger element which is detachable.

34. A semiconductor wafer processor according to claim 31 further comprising a mounting flange which mounts the wafer gripping finger in the wafer support member; and wherein said at least one wafer gripping finger includes a central core having a detachable finger element.

35. A semiconductor wafer processor according to claim 31 further comprising a mounting flange which mounts the wafer gripping finger in the wafer support member; and wherein said at least one wafer gripping finger includes a central core having a finger element receptacle formed therein; said at least one wafer gripping finger also including a detachable finger element which is held in the finger element receptacle.

36. A semiconductor wafer processor according to claim 31 further comprising a stop member mounted in the at least one wafer gripping finger to limit angular displacement thereof.

37. A semiconductor wafer processor according to claim 31 wherein said at least one wafer gripping finger includes a finger extension which engages the at least one pivot control link; said finger extension including a groove through which at least a portion of the pivot control link extends.

38. A semiconductor wafer processor according to claim 31 wherein said at least one pivot control link includes a U-shaped pivot control link assembly having two arms.

39. A semiconductor wafer processor according to claim 31 wherein said at least one pivot control link includes a U-shaped pivot control link assembly having two arms which pivot about a pivot control link pivot axis lying approximately within a medial plane about which the wafer gripping finger is angularly displaced by said at lest one finger actuator.

40. A semiconductor wafer processor according to claim 31 wherein said pivot control link includes two arms extending along opposing sides of the wafer gripping finger.

41. A semiconductor wafer processor according to claim 31 wherein said at least one finger actuator engages the pivot control link.

42. A semiconductor wafer processor according to claim 31 wherein said at least one finger actuator includes a yoke which engages a U-shaped pivot control link.

43. A semiconductor wafer processor according to claim 31 wherein said at least one finger actuator includes a yoke which detachably engages a U-shaped pivot control link; and further comprising an actuator lock which controllably locks the yoke to the pivot control link.

44. A semiconductor wafer processor according to claim 31 wherein said at least one finger actuator includes a yoke which detachably engages a U-shaped pivot control link; and further comprising an actuator lock which is slidably mounted upon the finger actuator to controllably lock the yoke to the pivot control link.

* * * * *